(12) United States Patent
Hashigami et al.

(10) Patent No.: US 11,984,522 B2
(45) Date of Patent: May 14, 2024

(54) HIGH-EFFICIENCY BACKSIDE CONTACT SOLAR CELL AND METHOD FOR MANUFACTURING THEREOF

(71) Applicant: SHIN-ETSU CHEMICAL CO., LTD., Tokyo (JP)

(72) Inventors: Hiroshi Hashigami, Annaka (JP); Takenori Watabe, Annaka (JP); Hiroyuki Ohtsuka, Karuizawa-machi (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 434 days.

(21) Appl. No.: 16/623,872

(22) PCT Filed: May 7, 2018

(86) PCT No.: PCT/JP2018/017615
§ 371 (c)(1),
(2) Date: Dec. 18, 2019

(87) PCT Pub. No.: WO2019/003638
PCT Pub. Date: Jan. 3, 2019

(65) Prior Publication Data
US 2021/0143291 A1    May 13, 2021

(30) Foreign Application Priority Data
Jun. 26, 2017    (JP) .................... 2017-124479

(51) Int. Cl.
*H01L 31/068*    (2012.01)
*H01L 31/05*     (2014.01)
*H01L 31/18*     (2006.01)

(52) U.S. Cl.
CPC ...... *H01L 31/0682* (2013.01); *H01L 31/0516* (2013.01); *H01L 31/186* (2013.01)

(58) Field of Classification Search
CPC ............ H01L 31/0682; H01L 31/0516; H01L 31/022441; H01L 31/022425
See application file for complete search history.

(56) References Cited

U.S. PATENT DOCUMENTS 8,263,858 B2 *   9/2012   Akimoto ............. H01L 31/1804
                                                    252/514
10,998,463 B2 *  5/2021   Hashigami ............. H01L 31/18
(Continued)

FOREIGN PATENT DOCUMENTS

CN   101383386 A    3/2009
JP   S61-59546 B2   12/1986
(Continued)

OTHER PUBLICATIONS

Feb. 23, 2021 Search Report issued in European Patent Application No. 18825325.6.
(Continued)

*Primary Examiner* — Bac H Au
(74) *Attorney, Agent, or Firm* — Oliff PLC

(57) ABSTRACT

A backside contact solar cell has, on a first main surface of a crystal silicon substrate, a p-type region having a p-conductive type and an n-type region having an n-conductive type, and a positive electrode formed on the p-type region and a negative electrode formed on the n-type region, wherein the positive electrode includes a laminated conductor of a first electric conductor which is formed on the p-type region and which includes a group III element and a second electric conductor which is laminated on the first electric conductor and which has a lower content ratio of the group III element than the first electric conductor, and the negative electrode includes the second electric conductor formed on the n-type region. In this way, a low-cost backside contact solar cell has a high photoelectric conversion efficiency.

9 Claims, 5 Drawing Sheets

(56) References Cited

U.S. PATENT DOCUMENTS

| | | | |
|---|---|---|---|
| 11,049,988 B2* | 6/2021 | Watabe | H01L 31/022441 |
| 2009/0056798 A1* | 3/2009 | Merchant | H01B 1/16 |
| | | | 252/514 |
| 2010/0258182 A1* | 10/2010 | Akimoto | H01L 31/1804 |
| | | | 419/10 |
| 2012/0160314 A1 | 6/2012 | Prince et al. | |
| 2012/0222721 A1* | 9/2012 | Gorczyca | H01L 31/0682 |
| | | | 136/246 |
| 2012/0291846 A1* | 11/2012 | Mikami | H01L 31/0516 |
| | | | 257/E31.124 |
| 2012/0305072 A1* | 12/2012 | Fujimori | H01L 31/022441 |
| | | | 438/98 |
| 2013/0042912 A1* | 2/2013 | Kurihara | B23K 1/203 |
| | | | 228/256 |
| 2013/0112253 A1* | 5/2013 | Oh | H01L 31/0682 |
| | | | 136/255 |
| 2013/0133729 A1 | 5/2013 | Mo et al. | |
| 2013/0247976 A1* | 9/2013 | Li | H01L 31/068 |
| | | | 136/256 |
| 2013/0288425 A1* | 10/2013 | Rana | B23K 26/0622 |
| | | | 438/98 |
| 2013/0333743 A1* | 12/2013 | Ishii | H01L 31/0682 |
| | | | 136/244 |
| 2014/0209158 A1* | 7/2014 | Lai | H01L 31/0682 |
| | | | 136/255 |
| 2014/0210073 A1 | 7/2014 | Tanaka | |
| 2014/0360567 A1* | 12/2014 | Seutter | H01L 31/02167 |
| | | | 420/548 |
| 2014/0366928 A1* | 12/2014 | Niinobe | H01L 31/022441 |
| | | | 136/246 |
| 2015/0027524 A1* | 1/2015 | Seyedmohammadi | H01L 31/02167 |
| | | | 252/514 |
| 2015/0129037 A1 | 5/2015 | Nam et al. | |
| 2015/0214397 A1* | 7/2015 | Chung | H01L 31/02168 |
| | | | 438/98 |
| 2015/0243818 A1* | 8/2015 | Kim | H01L 31/0508 |
| | | | 136/244 |
| 2015/0263193 A1* | 9/2015 | Chung | H01L 31/0682 |
| | | | 136/256 |
| 2015/0372171 A1* | 12/2015 | Wang | C03C 8/16 |
| | | | 252/514 |
| 2016/0190365 A1* | 6/2016 | Moslehi | H01L 31/044 |
| | | | 136/244 |
| 2016/0268458 A1 | 9/2016 | Kimoto et al. | |
| 2016/0380138 A1* | 12/2016 | Chung | H01L 31/068 |
| | | | 438/87 |
| 2017/0033242 A1* | 2/2017 | Nam | H01L 31/0516 |
| 2017/0069771 A1* | 3/2017 | Jang | H01L 31/0516 |
| 2017/0098722 A1* | 4/2017 | Chang | H01L 31/02008 |
| 2018/0033899 A1 | 2/2018 | Nam et al. | |
| 2018/0248056 A1* | 8/2018 | Hieda | H01L 31/022466 |
| 2019/0181288 A1* | 6/2019 | Hashigami | H01L 31/0682 |

FOREIGN PATENT DOCUMENTS

| | | |
|---|---|---|
| JP | 2002-511190 A | 4/2002 |
| JP | 2004-179334 A | 6/2004 |
| JP | 2014-029963 A | 2/2014 |
| JP | 2015-095653 A | 5/2015 |
| JP | 2015-177175 A | 10/2015 |
| JP | 2015-188089 A | 10/2015 |
| JP | 2017/051482 A1 | 3/2017 |
| KR | 10-2012-0102590 A | 9/2012 |
| KR | 10-2012-0113548 A | 10/2012 |
| KR | 10-2013-0104776 A | 9/2013 |
| KR | 10-2015-0040830 A | 4/2015 |
| WO | 2015/060432 A1 | 4/2015 |

OTHER PUBLICATIONS

Jun. 19, 2018 International Search Report issued in International Patent Application No. PCT/JP2018/017615.

Jan. 13, 2022 Office Action issued in Indian Patent Application No. 201947053345.

Jul. 15, 2022 Office Action issued in Chinese Patent Application No. 201880043093.2.

Apr. 21, 2023 Office Action issued in Korean Patent Application No. 10-2019-7038090.

\* cited by examiner

[FIG. 1]
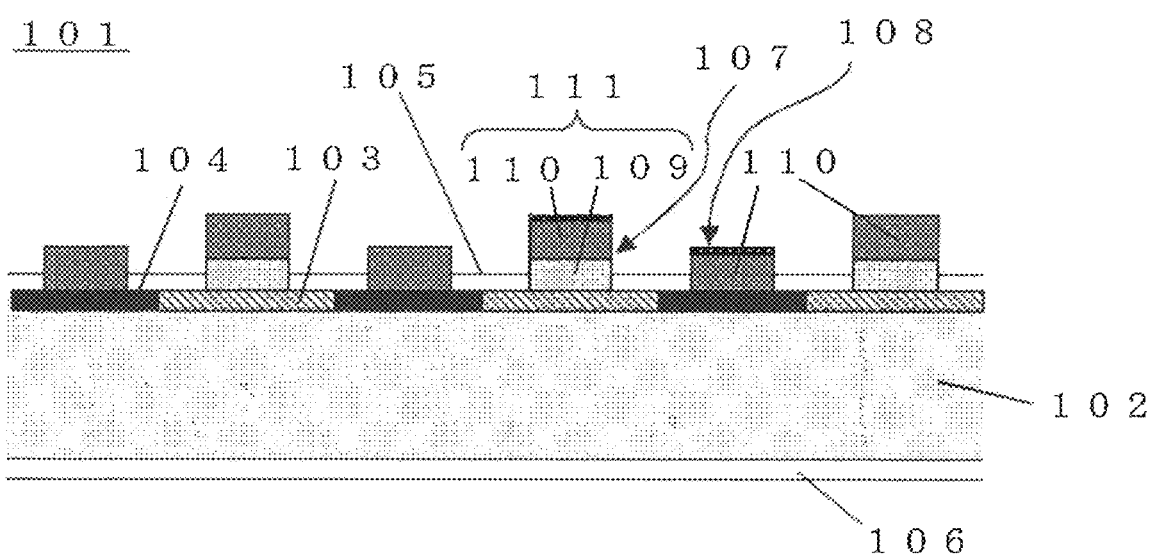

[FIG. 2]
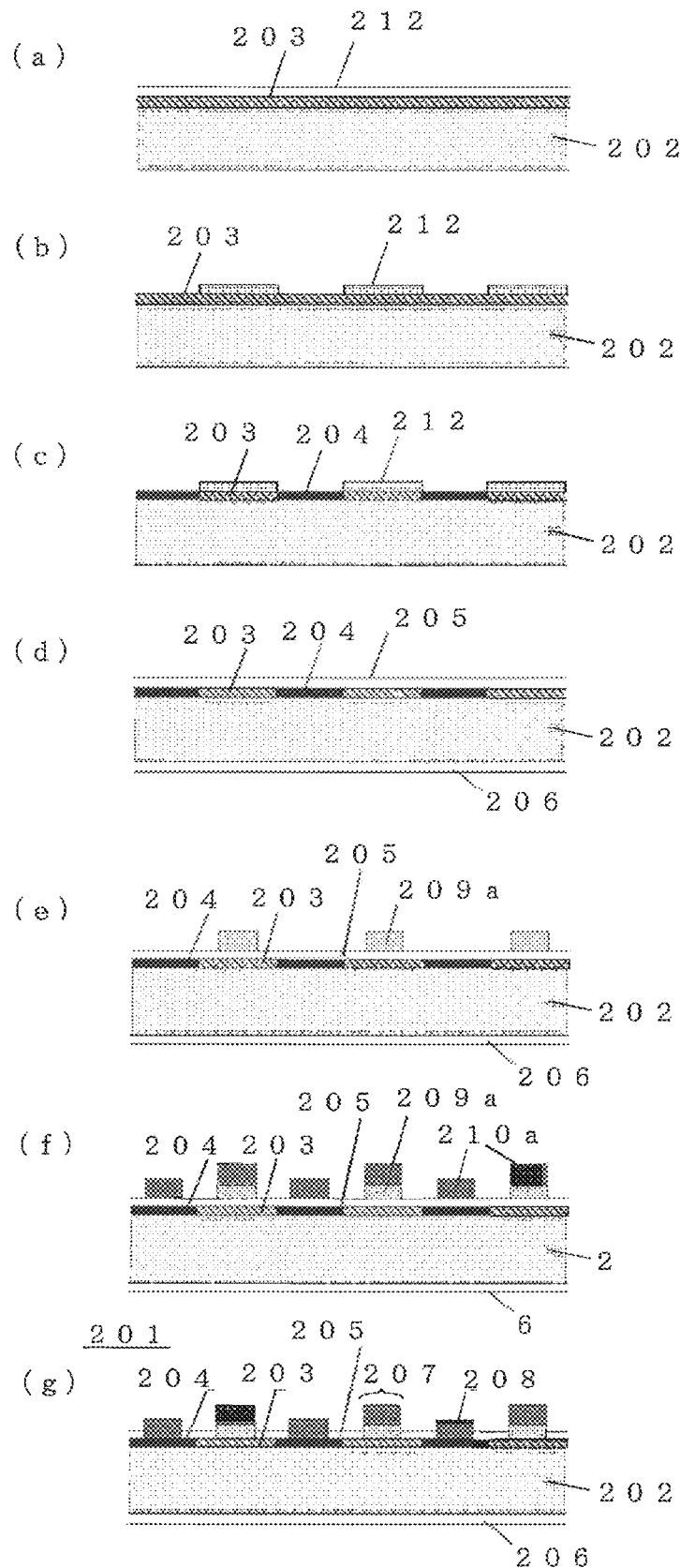

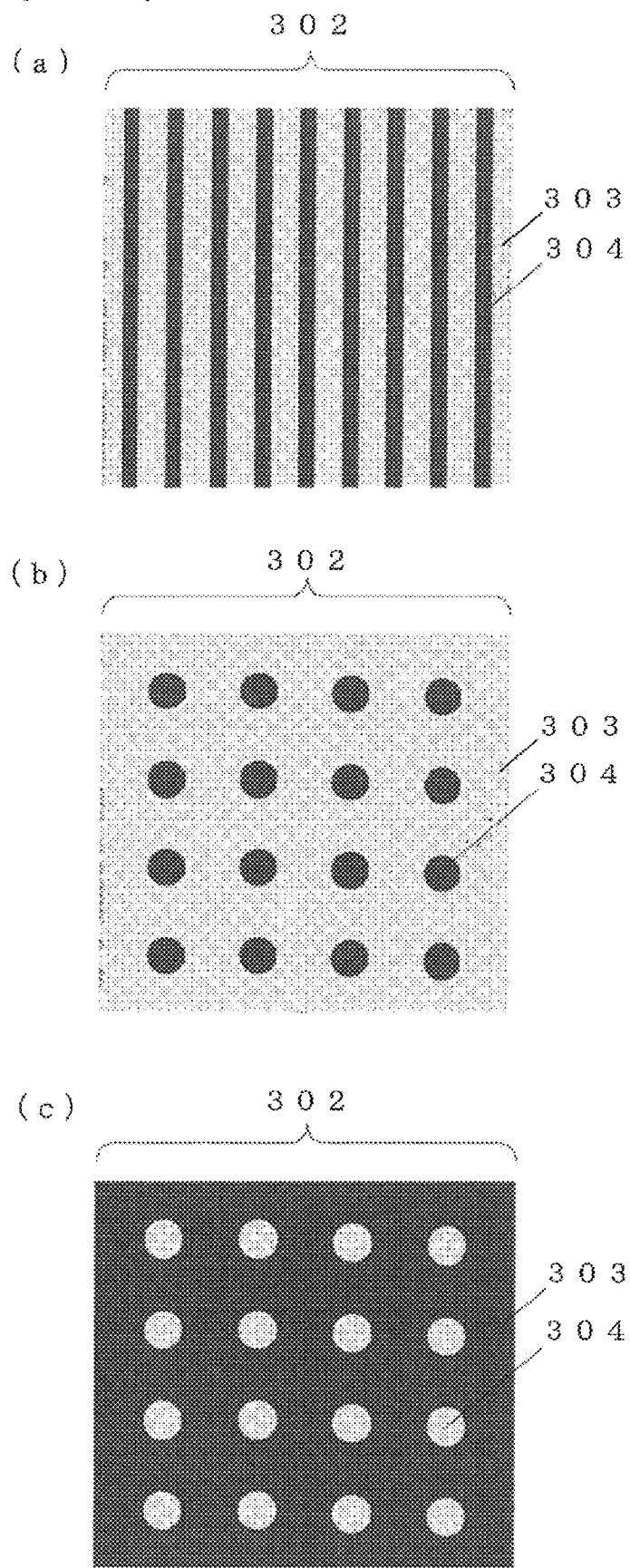

[FIG. 4]
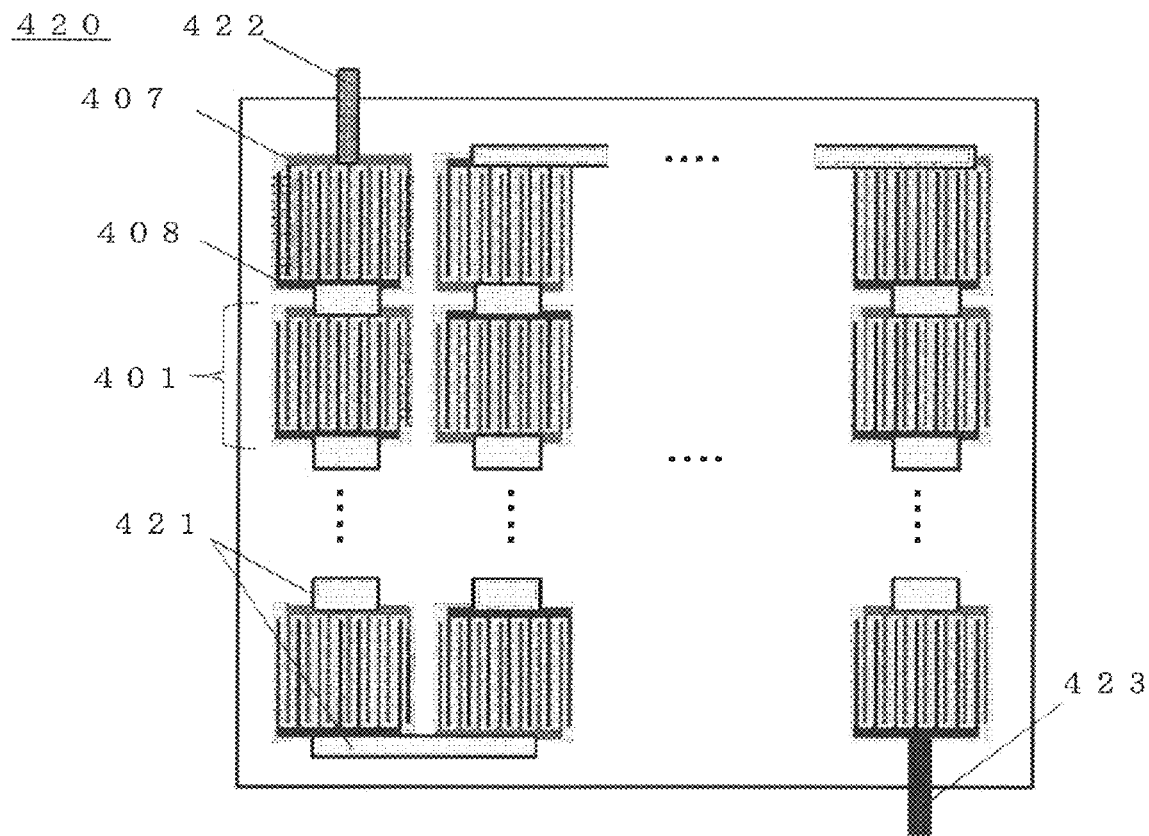
[FIG. 5]
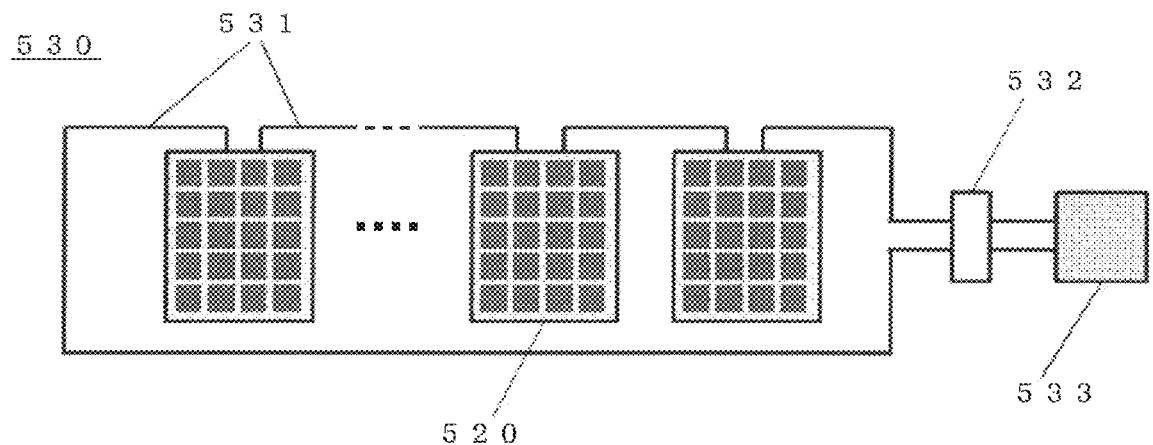

[FIG. 6]
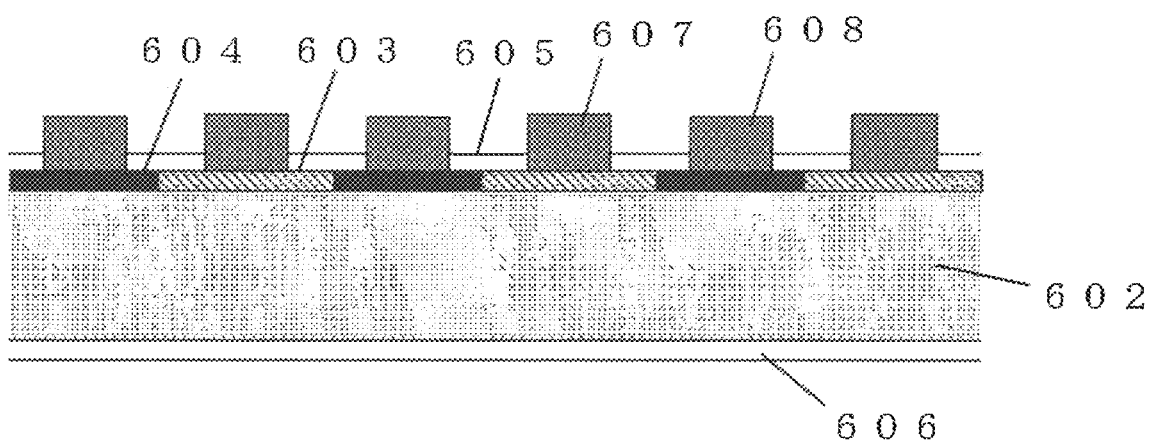

HIGH-EFFICIENCY BACKSIDE CONTACT SOLAR CELL AND METHOD FOR MANUFACTURING THEREOF

TECHNICAL FIELD

The present invention relates to: a high-efficiency backside contact solar cell and a method for manufacturing thereof.

BACKGROUND ART

As a method for improving photoelectric conversion efficiency of a crystal silicon solar cell, in recent years, a so-called backside contact solar cell, in which no electrodes are provided on a light receiving surface to eliminate optical loss due to shadow of electrodes, has been widely studied.

FIG. 6 is a schematic diagram showing a basic structure of a general backside contact solar cell. It is to be noted that the light receiving surface faces downward in the drawing. As shown in FIG. 6, the backside contact solar cell 601 has, on a non-light receiving surface of a substrate 602, a p-type region 603 in which a group III element such as boron or aluminum is diffused in high concentration is formed, and an n-type region 604 in which a group V element such as phosphorous or antimony is diffused in high concentration is formed so as to be adjacent thereto.

The p-type region 603 and the n-type region 604 are covered with a passivation film 605 formed mainly of a single layer film or a laminated film of silicon oxide, silicon nitride, aluminum oxide, or silicon carbide, etc. for reducing loss due to recombination of photo-excited carriers. Further, an opposite surface (light receiving surface) is covered with an antireflection film 606 formed of a single layer film or a laminated film of silicon nitride, titanium oxide, tin oxide, zinc oxide, silicon oxide, or aluminum oxide, etc.

Further, a positive electrode 607 and a negative electrode 608 are formed so as to penetrate the passivation film 605. In terms of cost, these electrodes are generally formed by applying a conductive paste which has fine metal particles of silver, etc. mixed in an organic binder to predetermined areas by screen plate printing or dispensing, and subsequently performing a heat treatment at approximately several hundred to 850° C.

However, in reality, if a general silver paste as described above is applied uniformly to a p-type silicon and an n-type silicon, contact resistance between the p-type silicon and the electrode often becomes large. This arises from the fact that work function difference with the metal in the conductive paste differs depending on the conductivity type of the silicon.

To counter this problem, for example, Patent Document 1 discloses that by adding 6 to 30 mass % of aluminum powder as solid contents of a conductive paste mainly composed of silver, a favorable electrical contact can be obtained.

Patent Document 2 discloses a method in which, using a silver paste with gallium or indium added, electrical contact is obtained by introducing the impurity into the p-type silicon by heat treatment.

CITATION LIST

Patent Literature

Patent Document 1: Japanese Examined Patent Application Publication No. S61-59546

Patent Document 2: Japanese Unexamined Patent Application Publication No. 2002-511190

SUMMARY OF INVENTION

Technical Problem

However, on the other hand, there has been a problem that additives formed of a group III element have a low electric conductivity, and if added to an electrode agent, wiring resistance is increased. In addition, there has been a problem that, with a backside contact solar cell, which has both positive and negative electrodes disposed on a non-light receiving surface of a substrate, degrading of output characteristics due to high wiring resistance becomes particularly conspicuous since photocurrent density is high compared to a conventional solar cell which has electrodes on both surfaces of a substrate.

The present invention has been made in view of the above-described problems, and an object of the present invention is to provide a low-cost backside contact solar cell that can be manufactured simply and that has a high photoelectric conversion efficiency. Another object of the present invention is to provide a low-cost photovoltaic module and photovoltaic power generation system that have a high photoelectric conversion efficiency. Another object of the present invention is to provide a method for manufacturing a backside contact solar cell with a high photoelectric conversion efficiency and with little resistance loss in electrodes by a simple method.

Solution to Problem

To achieve the object, the present invention provides a solar cell which is a backside contact solar cell that has, on a first main surface of a crystal silicon substrate, a p-type region having a p-conductive type and an n-type region having an n-conductive type, and that is provided with a positive electrode formed on the p-type region and a negative electrode formed on the n-type region, wherein the positive electrode comprises a laminated conductor of a first electric conductor which is formed on the p-type region and which includes a group III element and a second electric conductor which is laminated on the first electric conductor and which has a lower content ratio of the group III element than the first electric conductor, and the negative electrode comprises the second electric conductor formed on the n-type region.

The positive electrode of such a solar cell has a low contact resistance since the first electric conductor, which is in contact with the silicon substrate includes a group III element, and a low wiring resistance since the second electric conductor, which is connected to a wiring has a lower content ratio of the group III element than the first electric conductor. That is, the positive electrode has a favorable electrical contact between the silicon substrate and the electrode, and further, the wiring resistance is reduced. As a result, the inventive solar cell is a backside contact solar cell with little resistance loss and high efficiency.

At this time, the first electric conductor may be mainly composed of silver, or the first electric conductor may be mainly composed of aluminum.

When the first electric conductor is mainly composed of silver, a silver paste can be used. On the other hand, when the first electric conductor is mainly composed of aluminum, which has a relatively low cost, the cost of the solar cell can be reduced.

Further, the inventive solar cell is preferably provided with a passivation film formed on surfaces of the p-type region and the n-type region where the positive electrode and the negative electrode are not formed.

Such a solar cell has a higher efficiency since recombination of electrons and holes on the surface of the silicon substrate can be suppressed by the passivation film.

Further, to achieve the above object, the present invention provides a photovoltaic module comprising the solar cells described above electrically connected to each other.

A photovoltaic module with the inventive solar cells electrically connected to each other as described above has little resistance loss.

Further, to achieve the above object, the present invention provides a photovoltaic power generation system comprising a plurality of the photovoltaic modules described above electrically connected to each other.

A plurality of the photovoltaic modules with the inventive solar cells connected to each other can be connected to make a photovoltaic power generation system, and such a photovoltaic power generation system has little resistance loss.

Further, to achieve the above object, the present invention provides a method for manufacturing a solar cell comprising the steps of: forming, on a first main surface of a crystal silicon substrate, a p-type region having a p-conductive type and an n-type region having an n-conductive type, forming, on the p-type region, a first electric conductor which includes a group III element, and forming, on both the first electric conductor and the n-type region, a second electric conductor which has a lower content ratio of the group III element than the first electric conductor, wherein by the step of forming the first electric conductor and the step of forming the second electric conductor, a positive electrode comprising a laminated conductor of the first electric conductor and the second electric conductor and a negative electrode comprising the second electric conductor are formed.

In this way, a backside contact solar cell with a high photoelectric conversion efficiency and little resistance loss in electrodes can be manufactured by a simple method. In particular, by such a method, it is possible to perform part of the positive electrode formation and the negative electrode formation at the same time without providing a new step, and a high-efficiency solar cell can be manufactured at low cost.

At this time, the step of forming the first electric conductor and the step of forming the second electric conductor preferably comprise a step of screen printing or dispense-forming an electrode agent.

By adopting such methods, it is possible to manufacture a solar cell at low cost with favorable productivity.

Further, the inventive method for manufacturing a solar cell preferably comprises, before the step of forming the first electric conductor and the step of forming the second electric conductor, a step of forming, on a surface of the p-type region and the n-type region, a passivation film, wherein in the step of forming the first electric conductor, the first electrode agent which includes a group III element is applied onto the p-type region via the passivation film, in the step of forming the second electric conductor, a second electrode agent which has a lower content ratio of the group III element than the first electrode agent is applied onto both the first electrode agent and the n-type region via the passivation film, and after the step of forming the second electric conductor, by sintering the first electrode agent and the second electrode agent, the positive electrode and the negative electrode are formed.

By thus forming a passivation film, it is possible to manufacture a solar cell with a higher efficiency. In addition, the above method is a simple method.

Advantageous Effects of Invention

The inventive solar cell is provided with a positive electrode that has both a favorable electrical contact and a low wiring resistance, and therefore, resistance loss of the solar cell output is reduced. In addition, according to the inventive method for manufacturing a solar cell, it is possible to manufacture such a solar cell with reduced resistance loss and a high efficiency simply and at low cost. In particular, in the inventive method for manufacturing a solar cell, a screen printing method or a dispensing method can be adopted, and further, since part of the positive electrode formation and the negative electrode formation can be performed at the same time, a solar cell with a high photoelectric conversion efficiency can be manufactured at lower cost with higher productivity.

BRIEF DESCRIPTION OF DRAWINGS

FIG. 1 is a diagram showing an embodiment of the structure of the inventive solar cell;

FIG. 2 is a diagram showing an example of the inventive method for manufacturing a solar cell;

FIG. 3 is a diagram showing an embodiment of a backside structure of the inventive solar cell;

FIG. 4 is a diagram showing an embodiment of the inventive photovoltaic module;

FIG. 5 is a diagram showing an embodiment of the inventive photovoltaic power generation system;

FIG. 6 is a diagram showing a basic structure of a conventional backside contact solar cell.

DESCRIPTION OF EMBODIMENTS

Hereinafter, embodiments of the present invention will be described, but the present invention is not limited thereto.

Firstly, an example of the structure of the inventive solar cell will be described specifically with reference to FIG. 1. It is to be noted that the light receiving surface faces downward in FIG. 1.

As shown in FIG. 1, the inventive backside contact solar cell 101 (hereinafter, also referred to simply as a solar cell) has, on a first main surface (the surface that becomes a non-light receiving surface when made into a solar cell) of a crystal silicon substrate 102, a p-type region 103 having a p-conductive type and an n-type region 104 having an n-conductive type, and that is provided with a positive electrode 107 formed on the p-type region 103 and a negative electrode 108 formed on the n-type region 104.

More specifically, the following is possible. The inventive backside contact solar cell 101 may have, formed locally on the first main surface (the surface that becomes a non-light receiving surface when made into a solar cell) of the crystal silicon substrate 102 which has a p or an n conductive type, the p-type region 103 which has a p-conductive type, having a dopant for providing p-type conductivity added with a higher concentration than the dopant concentration of the crystal silicon substrate 102. Further, in the same first main surface, the n-type region 104 which has an n-conductive type, having a dopant for providing n-type conductivity added with a higher concentration than the dopant concentration of the silicon substrate 102 may be formed so as to be adjacent to the p-type region 103.

On the p-type region 103, the positive electrode 107 including a laminated conductor 111 of a first electric conductor 109 and a second electric conductor 110 is formed. On the other hand, on the n-type region 104, the negative electrode 108 including the second electric conductor 110 is formed. The first electric conductor 109, which is formed on the p-type region 103 and which forms part of the positive electrode 107 includes a group III element.

For the first electric conductor 109, a sintered body of an aluminum paste with glass frit added or a sintered body of a silver paste with a group III element and glass frit added is suitably used for the object of reducing contact resistance with the p-type region 103. As the group III element, a simple substance or a compound of boron, gallium, or indium may be used, but considering cost, it is preferable to use aluminum. As the group III element compound, more specifically, it is preferable to include one or more types out of boron nitride, boron oxide, aluminum chloride, and aluminum bromide. It is necessary to appropriately adjust the content ratio of the group III element in the first electric conductor 109 depending on the added elements and the form thereof, but as an example, when using aluminum, the content ratio is preferably approximately 3 mass % or more. Further, the first electric conductor is preferably mainly composed of silver or aluminum. When silver is the main component, the content ratio of silver is preferably 50 mass % or more. When aluminum is the main component, the content ratio of aluminum is preferably 50 mass % or more.

Further, the second electric conductor 110 has a lower content ratio of the group III element than the first electric conductor 109. In particular, preferably, the second electric conductor 110 has glass frit added, and is formed from the sintered body of a general silver paste with no group III element added. If the group III element is added to the second electric conductor 110, which is to become the negative electrode 108, not only is the wiring resistance increased, contact resistance is increased due to formation of an energy barrier on the surface of the n-type region 104, and solar cell characteristics are degraded.

Thus, by giving the positive electrode 107 a laminate structure of the first electric conductor 109, which obtains a favorable electrical contact with the p-type region 103 and the second electric conductor 110, which has a low wiring resistance, electric resistance loss is reduced, and it becomes possible to enhance the photoelectric conversion efficiency of the solar cell.

Further, it is preferable to form a passivation film 105 on portions of the p-type region 103 with no positive electrodes formed and portions of the n-type region 104 with no negative electrodes formed. In this case, that is, the inventive backside contact solar cell 101 is provided with the passivation film 105 formed on surfaces of the p-type region 103 and the n-type region 104 where a positive electrode 107 and a negative electrode 108 are not formed. Since recombination of holes and electrons on the surface of the crystal silicon substrate 102 can be suppressed by such a passivation film 105, the solar cell is of higher efficiency. For the passivation film 105, silicon oxide, silicon nitride, aluminum oxide, or silicon carbide, etc. can be used. These may be used as a single layer, or they may be combined as a laminated film. Film thickness of the passivation film 105 is preferably several nm to 100 nm in order to obtain sufficient passivation effect. In addition, the surface of the p-type region 103 and the surface of the n-type region 104 may each have a film with different features applied.

Further, it is preferable to form an antireflection film 106 on the light receiving surface of the crystal silicon substrate 102. As the antireflection film 106, it is preferable to use a dielectric with a refractive index of 1.8 to 2.2 from the need to obtain an optical confinement effect, and for this reason, silicon nitride, silicon carbide, titanium oxide, tin oxide, zinc oxide, etc. can be used. These dielectrics are preferably used at a film thickness of 70 nm to 120 nm order to obtain an optimal optical confinement effect. In addition, these may be used as a single layer, and although it is not shown in the drawings, an intermediate layer of silicon oxide or aluminum oxide with a film thickness of 40 nm or less may be formed between the above dielectric and the crystal silicon substrate 102. In this way, the passivation effect on the surface of the light receiving surface can be enhanced.

Next, the inventive method for manufacturing a solar cell will be described with reference to FIG. 2, but the present invention is not limited thereto.

A crystal silicon substrate 202 may be a crystal silicon which has a resistivity of 0.1 to 10 Ω·cm and a p or an n conductive type, and although it is not shown in the drawings, a roughness structure may be formed on the surface of the substrate for optical confinement. The roughness structure can be obtained by immersing the crystal silicon substrate 202 in an acid or alkali solution for a predetermined period. As the acid solution, typically, a mixed acid solution of nitrohydrofluoric acid, acetic acid, phosphoric acid, sulfuric acid, water, etc. is used. When the crystal silicon substrate 202 is immersed into this solution, minute grooves on the surface which gets rough upon processing of the substrate are preferentially etched, and thereby the roughness structure is formed. As the alkali solution, a potassium hydroxide aqueous solution, a sodium hydroxide aqueous solution or an aqueous solution of tetramethylammonium hydroxide may be used. Because the alkali etching progresses by forming Si—OH bond, its etching speed depends on crystal plane orientation, providing a roughness structure where a crystal surface having low etching speed is exposed.

A non-light receiving surface of the crystal silicon substrate 202 does not necessarily require a roughness structure. The surface would be rather flattened to reduce a surface area, as an effect of reducing carrier recombination loss could be expected. In this case, spin etching using a chemical containing nitrohydrofluoric acid or an in-line type one side cleaning apparatus can be used.

It is preferable that, after the roughness structure is formed, the crystal silicon substrate 202 is cleaned with an acid aqueous solution of hydrochloric acid, sulfuric acid, nitric acid, hydrofluoric acid, etc., or a mixed solution thereof. In terms of cost and characteristics, it is preferable to clean the substrate in hydrochloric acid. To enhance cleanliness, the substrate may be cleaned in a hydrochloric acid solution in which 0.5 to 5% of hydrogen peroxide is mixed and heated to 60 to 90° C.

Next, a p-type region having a p-conductive type and an n-type region having an n-conductive type are formed on the first main surface of the crystal silicon substrate. These can be formed by the steps shown in FIGS. 2(a) to (c) as described below, but this is not limiting. Firstly, as shown in FIG. 2(a), a p-type region 203 is formed on one side of the crystal silicon substrate 202. Using a diffusion source containing a group III element, the p-type region 203 can be formed, and in terms of electric characteristics and simplicity of the apparatus, it is preferable to perform vapor-phase diffusion at 900 to 1000° C. using, for example, boron bromide. In the inventive solar cell, it is necessary to form the p-type region 203 only on the back surface (the surface that becomes a non-light receiving surface when made into a solar cell). To achieve this, it is necessary to add a twist of performing diffusion in a state where two substrates are superimposed or forming a diffusion barrier such as silicon nitride on the light receiving surface side so that boron is not diffused on the light receiving surface. Further, it is also possible to form the p-type region 203 by performing heat diffusion at 900 to 1000° C. after a boron compound is applied on the substrate and dried, instead of vapor-phase diffusion. According to this method, boron diffusion to a non-applied surface can be suppressed relatively easily. Apart from this method, it is possible to perform single side diffusion by a spin coating method using a diffusing agent, a spray method, etc.

Further, a diffusion barrier 212 can be formed on the p-type region 203. As the diffusion barrier, silicon nitride or silicon oxide which can be obtained through a chemical vapor deposition method or a physical vapor deposition method can be suitably used. Although depending on a film manufacturing method, the film is formed with a thickness of approximately 50 to 200 nm in this case. Apart from these, a silicon oxide film obtained through heat treatment may be used. In this case, the substrate is subjected to heat treatment in an oxide or water vapor atmosphere at 800 to 1100° C. to grow silicon oxide of 20 to 200 nm. Incidentally, this heat treatment and diffusion of the group III element such as boron may be performed in succession.

Subsequently, as in FIG. 2(b), the diffusion barrier 212 at a portion where the n-type region is to be formed is partially removed to expose the p-type region 203. The diffusion barrier 212 can be removed by, for example, screen printing etching paste on a desired portion and performing heat treatment at 100 to 400° C. Further, it is also possible to use laser ablation whose process is simpler.

Next, as shown in FIG. 2(c), an n-type region 204 can be formed in an opening portion of the diffusion barrier. Using a diffusion source containing a group V element, the n-type region 204 can be formed, and in terms of electric characteristics and simplicity of the apparatus, it is preferable to perform vapor-phase diffusion at 800 to 980° C. using, for example, phosphorous oxychloride. In the inventive solar cell, it is necessary to form the n-type region 204 only on the back surface (non-light receiving surface). To achieve this, it is necessary to add a twist of performing diffusion in a state where two substrates are superimposed or forming a diffusion barrier such as silicon nitride on the light receiving surface side so that phosphorous is not diffused on the light receiving surface. Further, it is also possible to form the n-type region 204 by performing heat diffusion at 800 to 980° C. after a phosphorous compound is applied on the substrate and dried, instead of vapor-phase diffusion. According to this method, phosphorous diffusion to a non-applied surface can be suppressed relatively easily.

Diffusion of the group V element such as phosphorus may also be performed after the p-type region 203 exposed at the opening portion of the diffusion barrier 212 is removed by etching, as an alternative way to the above-described method. In this case, for example, by immersing the crystal silicon substrate 202 in a sodium hydroxide aqueous solution or a potassium hydroxide aqueous solution, the p-type region 203 at the opening portion can be removed selectively, since the diffusion barrier 212 functions as a mask.

A pattern for forming the p-type region and the n-type region may be, for example, a pattern in which the p-type region 303 and the n-type region 304 are linearly adjacent on the crystal silicon substrate 302 as shown in FIG. 3(a), or, as in FIG. 3(b) and FIG. 3(c), either the p-type region 303 or the n-type region 304 may be formed in an island shape.

After diffusion of the group V element such as phosphorus, etc., boron glass, a diffusion barrier 212 and phosphorus glass formed on the diffusion surface are removed with hydrofluoric acid, etc. To maintain cleanliness of the surface of the substrate, more preferably, the substrate may be cleaned with a solution in which ammonia water or an aqueous solution of tetramethylammonium hydroxide is mixed with 0.5 to 5% of hydrogen peroxide and is heated at 60 to 90° C. In addition, the substrate may be cleaned with hydrochloric acid, sulfuric acid, nitric acid or a mixed solution thereof, or a solution in which these are mixed with 0.5 to 5% of hydrogen peroxide and which is heated at 60 to 90° C. Further, it is preferable to remove an oxide film on the surface of the substrate with an aqueous solution of hydrofluoric acid in the last stage.

Next, as shown in FIG. 2(d), a passivation film 205 can be formed on the p-type region and the n-type region. For the passivation film 205, silicon nitride is suitably used. In this case, using plasma CVD, a film with a high passivation effect can be obtained by appropriately adjusting the mixing ratio of silane, ammonia, and hydrogen. Apart from this, it is also possible to form silicon oxide, aluminum oxide, or silicon carbide, etc. by a method such as heat treatment, CVD method, sputtering method, or atomic layer deposition method. In addition, these films may be a single layer or they may be combined with any of the above to form a laminate. Further, the passivation film 205 is preferably formed with a film thickness of several nm to 100 nm in order to obtain sufficient passivation effect.

Subsequently, an antireflection film 206 is formed on the light receiving surface of the crystal silicon substrate 202. As the antireflection film 206, it is preferable to use a dielectric with a refractive index of 1.8 to 2.2 from the need to obtain an optical confinement effect, and for this reason, silicon nitride, silicon carbide, titanium oxide, tin oxide, zinc oxide, etc. can be used. These films are preferably used at a film thickness of 70 nm to 120 nm in order to obtain an optimal optical confinement effect. In addition, these may be used as a single layer, and although it is not shown in the drawings, an intermediate layer of silicon oxide or aluminum oxide with a film thickness of 40 nm or less may be formed between the above film and the crystal silicon substrate 202. In this way, the passivation effect on the surface of the light receiving surface can be enhanced.

Next, as shown in FIG. 2(e), a first electrode agent 209a is applied on the p-type region 2. As the first electrode agent 209a, an aluminum paste with aluminum powder and glass frit mixed in an organic binder or a silver paste with silver powder, glass frit, and a simple substance or a compound of a group III element mixed in an organic binder can be used suitably in order to obtain a favorable electrical contact with the p-type region 203. In the latter case, it is necessary to appropriately adjust the content ratio of the group III element depending on the added elements and the form thereof, and considering cost, it is preferable to use a silver paste with aluminum powder added at a solid content ratio of 3 mass % or more.

There is no particular restriction to the method for forming the first electrode agent 209a, but in terms of productivity, it is preferable to apply by dispense-forming or screen print the conductive paste onto the p-type region 203.

Subsequently, the crystal silicon substrate 202 is dried in an atmosphere of 100 to 300° C.

Subsequently, as shown in FIG. 2(f), a second electrode agent 210a is formed on the first electrode agent 209a and the n-type region 204 by application. As the second electrode agent 210a, a silver paste which does not include a group III element and has silver powder and glass frit mixed with an organic binder is suitably used.

Subsequently, the substrate is dried in an atmosphere of 100 to 300° C.

Subsequently, the substrate is, for example, baked for 1 second to 10 minutes in an atmosphere of approximately 700 to 890° C. When the first electrode agent 209a and the second electrode agent 210b are sintered by this heat treatment, as shown in FIG. 2(g), a positive electrode 207 and a negative electrode 208 are formed, and further, the passivation film 205 is eroded by the electrode agent and both electrodes come into electrical contact with the crystal silicon substrate 202. The inventive backside contact solar cell 201 can be manufactured as described above.

Further, by electrically connecting a plurality of the inventive solar cells obtained by the above steps in series, a photovoltaic module is obtained. FIG. 4 is an example of the features on the non-light receiving surface side of the inventive photovoltaic module 420. A positive electrode 407 of a solar cell 401 is electrically connected to a negative electrode 408 of an adjacent solar cell through a tab 421, and the number of solar cells required for a predetermined output are connected. Incidentally, the positive electrode 407 of one solar cell is connected with a positive electrode terminal 422 of the photovoltaic module 420, and the negative electrode 408 of another solar cell is connected with a negative electrode terminal 423 of the photovoltaic module 420. Although not shown in FIG. 4, the connected solar cells are sealed with a cover glass, a filler, and further, a back sheet. As the cover glass, a soda-lime glass is extensively used. Further, as the filler, ethylene vinyl acetate, polyolefin, or silicone, etc. is used. As the back sheet, a functional film using polyethylene terephthalate is generally adopted.

Further, FIG. 5 shows the basic features of a photovoltaic power generation system formed by electrically connecting a plurality of the above photovoltaic modules. The photovoltaic power generation system 530 is a plurality of photovoltaic modules 520 coupled in series through wiring 531 and supplies generated power to an external load circuit 533 via an inverter 532. Although not shown in FIG. 5, this system may further include a secondary battery which stores the generated power.

EXAMPLES

Hereinafter, the present invention will be more specifically described with reference to Examples and Comparative Examples. However, the present invention is not limited to these Examples. In the Examples below, a backside contact solar cell was manufactured using the inventive method for manufacturing a solar cell.

Example 1

Firstly, in a phosphorus-doped n-type as-cut silicon substrate of 150 mm square, having a thickness of 200 μm and having specific resistance of 1 Ω·cm, after a damage layer was removed with a hot concentrated potassium hydroxide aqueous solution, the substrate was immersed in a 5% potassium hydroxide aqueous solution at 80° C. for 20 minutes to form texture in a random pyramid shape, and continuously, cleaned in a mixed solution of hydrochloric acid and hydrogen peroxide.

Subsequently, a mixture of a boron compound and a binder was spin coated on the back surface of the substrate, and boron was diffused through heat treatment at 1000° C. for 30 minutes to form a p-type region. Then, continuously, oxidizing heat treatment was performed at 1000° C. for 2 hours.

After the heat treatment, the oxide film at a portion where an n-type region was to be formed on the back surface of the substrate was removed in a line shape using laser radiation with a wavelength of 532 nm.

Next, the substrates were loaded on a quartz board such that light receiving surfaces of a pair of two substrates faced each other, and heat treatment was performed at 820° C. for 30 minutes by using phosphorous oxychloride to form an n-type region.

Next, after the substrate was immersed in a 10% HF aqueous solution to remove a glass layer, the substrate was cleaned by being sequentially immersed in a mixed solution of hydrochloric acid water and hydrogen peroxide water at 80° C., and a 2% HF aqueous solution, and then the substrate was rinsed with pure water, and then dried.

Next, on the light receiving surface of the substrate after cleaning, a silicon nitride with a film thickness of 90 nm was formed as an antireflection film by a plasma CVD method, and on the non-light receiving surface side, aluminum oxide with a film thickness of 10 nm was formed as a passivation film by an atomic layer deposition method, after which silicon nitride with a film thickness of 90 nm was further laminated.

Subsequently, a silver paste obtained by adding 10 mass % of aluminum powder to a mixture of silver powder and glass frit and mixing with an organic binder was applied to the p-type region by screen printing and drying was performed for one minute at 200° C.

Next, a silver paste with no group III element added was applied onto the n-type region and the dried silver paste formed on the p-type region by screen printing and dried for one minute at 200° C., after which a further heat treatment was performed for three seconds at 800° C., sintering the silver paste, and a solar cell was obtained.

Finally, output characteristics of the solar cell were measured with pseudo sunlight using a xenon lamp as a light source.

Example 2

In a crystal silicon substrate on which the same procedures were performed as Example 1 up to the formation of the passivation film and the antireflection film, an aluminum paste obtained by mixing a mixture of aluminum powder and glass frit with an organic binder was applied to a p-type region by screen printing, and drying was performed for one minute at 200° C.

Next, a silver paste with no group III element added was applied onto the n-type region and the dried aluminum paste formed on the p-type region by screen printing and further dried for one minute at 200° C., after which a heat treatment was performed for three seconds at 800° C., sintering the silver paste, and a solar cell was obtained.

Finally, output characteristics of the solar cell were measured with pseudo sunlight using a xenon lamp as a light source.

Comparative Example 1

In a crystal silicon substrate on which the same procedures were performed as Example 1 up to the formation of the passivation film and the antireflection film, a silver paste obtained by adding 10 mass % of aluminum powder to a mixture of silver powder and glass frit and mixing with an organic binder was applied to a p-type region by screen printing, and drying was performed for one minute at 200° C.

Next, a silver paste with no group III element added was applied onto the n-type region by screen printing and further dried for one minute at 200° C., after which a heat treatment was performed for three seconds at 800° C., sintering the silver paste, and a solar cell was obtained.

Finally, output characteristics of the solar cell were measured with pseudo sunlight using a xenon lamp as a light source.

The characteristics of the solar cells in the above Examples 1, 2, and Comparative Example 1 are shown in Table 1 below. In Table 1, Jsc indicates a short-circuit current, Voc indicates an open circuit voltage, FF indicates a fill factor, and Eff. Indicates conversion efficiency. In the inventive solar cell, resistance loss in the positive electrode was reduced and fill factor (FF) was improved, and a conversion efficiency higher than that of the Comparative Example was shown.

The results of the Examples and Comparative Example are shown in Table 1.

TABLE 1

|  | Jsc [mA/cm$^2$] | Voc [mV] | FF | Eff. [%] |
|---|---|---|---|---|
| Example 1 | 40.2 | 0.688 | 0.805 | 22.3 |
| Example 2 | 40.3 | 0.689 | 0.803 | 22.3 |
| Comparative Example 1 | 40.2 | 0.688 | 0.780 | 21.6 |

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A solar cell which is a backside contact solar cell, the solar cell comprising:
    a crystal silicon substrate having a first main surface,
    a p-type region having a p-conductive type, and having:
        a first p-type region surface formed on the first main surface, and
        a second p-type region surface positioned on an opposite side of the p-type region relative to the first p-type region surface; and
    an n-type region having an n-conductive type, and having:
        a first n-type region surface formed on the first main surface, and
        a second n-type region surface positioned on an opposite side of the n-type region relative to the first n-type region surface, and that is provided with:
    a positive electrode having a positive electrode surface formed on the second p-type region surface, and comprising a laminated conductor of:
        a first electric conductor which is formed on the second p-type region surface and which is mainly composed of silver and includes a group III element compound containing a group III element, and
        a second electric conductor which is laminated on the first electric conductor and which has a lower content ratio of the group III element than the first electric conductor, and
    a negative electrode having a negative electrode surface formed on the second n-type region surface, and comprising the second electric conductor,
    wherein:
    the group III element compound includes one or more compounds selected from the group consisting of boron nitride, aluminum chloride, and aluminum bromide, and
    the second p-type region surface, the second n-type region surface, the positive electrode surface, and the negative electrode surface together define a flat two-dimensional surface.

2. The solar cell according to claim 1, further comprising a passivation film formed on the second p-type region surface and the second n-type region surface where the positive electrode surface and the negative electrode surface are not formed.

3. A photovoltaic module comprising solar cells according to claim 2 electrically connected to each other.

4. A photovoltaic module comprising solar cells according to claim 1 electrically connected to each other.

5. A photovoltaic power generation system comprising a plurality of photovoltaic modules according to claim 4 electrically connected to each other.

6. A method for manufacturing a solar cell, the method comprising the steps of:
    forming, on a first main surface of a crystal silicon substrate:
        a p-type region having a p-conductive type, and having:
            a first p-type region surface formed on the first main surface, and
            a second p-type region surface positioned on an opposite side of the p-type region relative to the first p-type region surface, and
        an n-type region having an n-conductive type, and having:
            a first n-type region surface formed on the first main surface, and
            a second n-type region surface positioned on an opposite side of the n-type region relative to the first n-type region surface,
    forming, on the second p-type region surface, a first electric conductor which is mainly composed of silver and includes a group III element compound containing a group III element, and
    forming, on both the first electric conductor and the second n-type region surface, a second electric conductor which has a lower content ratio of the group III element than the first electric conductor,
    wherein:
    the group III element compound includes one or more compounds selected from the group consisting of boron nitride, aluminum chloride, and aluminum bromide,
    by the step of forming the first electric conductor and the step of forming the second electric conductor, a positive electrode and a negative electrode are formed,
    the positive electrode having a positive electrode surface formed on the second p-type region surface, and comprising a laminated conductor of:
        the first electric conductor and
        the second electric conductor and
    the negative electrode having a negative electrode surface formed on the second n-type region surface, and comprising the second electric conductor, and the second p-type region surface, the second n-type region surface, the positive electrode surface, and the negative electrode surface together define a flat two-dimensional surface.

7. The method for manufacturing a solar cell according to claim 6, wherein the step of forming the first electric conductor and the step of forming the second electric conductor comprise a step of screen printing or dispense-forming an electrode agent.

8. The method for manufacturing a solar cell according to claim 7 further comprising, before the step of forming the first electric conductor and the step of forming the second electric conductor, a step of forming, on the second p-type region surface and the second n-type region surface, a passivation film, wherein
- in the step of forming the first electric conductor, a first electrode agent which includes the group III element compound is applied onto the p-type region via the passivation film,
- in the step of forming the second electric conductor, a second electrode agent which has a lower content ratio of the group III element than the first electrode agent is applied onto both the first electrode agent and the n-type region via the passivation film, and
- after the step of forming the second electric conductor, by sintering the first electrode agent and the second electrode agent, the positive electrode and the negative electrode are formed.

9. The method for manufacturing a solar cell according to claim 6 further comprising, before the step of forming the first electric conductor and the step of forming the second electric conductor, a step of forming, on the second p-type region surface and the second n-type region surface, a passivation film, wherein
- in the step of forming the first electric conductor, a first electrode agent which includes the group III element compound is applied onto the p-type region via the passivation film,
- in the step of forming the second electric conductor, a second electrode agent which has a lower content ratio of the group III element than the first electrode agent is applied onto both the first electrode agent and the n-type region via the passivation film, and
- after the step of forming the second electric conductor, by sintering the first electrode agent and the second electrode agent, the positive electrode and the negative electrode are formed.

\* \* \* \* \*